United States Patent
Jung et al.

(10) Patent No.: US 9,087,774 B2
(45) Date of Patent: Jul. 21, 2015

(54) LDMOS DEVICE WITH SHORT CHANNEL AND ASSOCIATED FABRICATION METHOD

(71) Applicant: Monolithic Power Systems, Inc., San Jose, CA (US)

(72) Inventors: Jeesung Jung, San Jose, CA (US); Joel M. McGregor, San Jose, CA (US); Ji-Hyoung Yoo, Cupertino, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 14/038,647

(22) Filed: Sep. 26, 2013

(65) Prior Publication Data

US 2015/0084126 A1     Mar. 26, 2015

(51) Int. Cl.
*H01L 21/265* (2006.01)
*H01L 29/78* (2006.01)
*H01L 29/66* (2006.01)

(52) U.S. Cl.
CPC .... *H01L 21/26586* (2013.01); *H01L 29/66681* (2013.01); *H01L 29/7816* (2013.01)

(58) Field of Classification Search
USPC ......... 257/339, 162, 423, 611, E27.054, E29, 257/152, E29.187, E29.261, E21.196, 257/E21.427, E21.452, E21.455; 438/400, 438/418, 419, 420
See application file for complete search history.

(56) References Cited

U.S. PATENT DOCUMENTS

| | | | |
|---|---|---|---|
| 2008/0182394 A1* | 7/2008 | Yang et al. | 438/510 |
| 2010/0237411 A1* | 9/2010 | Hsieh | 257/336 |

* cited by examiner

*Primary Examiner* — Timor Karimy
(74) *Attorney, Agent, or Firm* — Perkins Coie LLP

(57) ABSTRACT

A method of fabricating an LDMOS device includes: forming a gate of the LDMOS device on a semiconductor substrate; performing tilt body implantation by implanting dopants of a first conductivity type in the semiconductor substrate using a mask, wherein the tilt body implantation is implanted at an angle from a vertical direction; performing zero tilt body implantation by implanting dopants of the first conductivity type using the same mask, wherein the zero tilt body implantation is implanted with zero tilt from the vertical direction, and wherein the tilt body implantation and the zero tilt body implantation are configured to form a body region of the LDMOS device; and forming a source region and a drain contact region of the LDMOS device, wherein the source region and the drain contact region are of a second conductivity type.

15 Claims, 14 Drawing Sheets

LDMOS DEVICE WITH SHORT CHANNEL AND ASSOCIATED FABRICATION METHOD

TECHNICAL FIELD

The present invention generally relates to semiconductor device, more particularly and not exclusively relates to LDMOS device and associated fabrication method.

BACKGROUND

Figure 1:
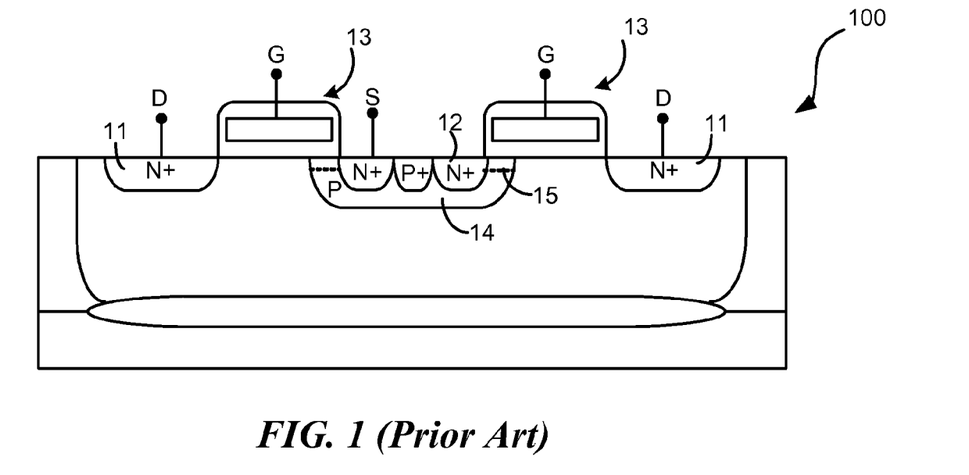
FIG. 1 shows a prior art LDMOS device.

Lateral Diffused Metal Oxide Semiconductor Field Effect Transistor (LDMOS) devices are widely used for high breakdown voltage and good thermal performance when compared to other types of transistor devices. An LDMOS device comprises a drain 11, a source 12, a gate 13 and a body 14 as shown in FIG. 1. When turned "ON", a voltage is applied on the gate 13, a channel region 15 below the gate 13 converts from p-type into n-type, and a current path forms between the drain 11 and the source 12.

High breakdown voltage and low on-resistance are two important parameters desired by an LDMOS device. In order to have a lower on-resistance and smaller cell pitch, short channel is preferred. However, in prior art short channel approaches, short channel may lead to lower punch-through breakdown voltage which is one critical parameter for an LDMOS device.

In order to achieve higher punch-through breakdown voltage, one solution is to have a shallower source junction. But this might cause leakage if silicide formation in the later process consumes too much source region. Another solution is to rely on the body formation of the normal lateral Double Diffused MOSFET (DDMOS). But this requires high thermal budget which would affect the other junction profiles. For example, in Bipolar-CMOS-DMOS (BCD) semiconductor process, the high thermal budget in forming the body region of a conventional DDMOS device would affect the CMOS devices and bipolar transistors. It would also require a large cell pitch.

Accordingly, an LDMOS device is required to address some or all of the above deficiencies.

SUMMARY

In one embodiment, a method of fabricating an LDMOS device comprises: forming a gate of the LDMOS device on a semiconductor substrate; performing tilt body implantation by implanting dopants of a first conductivity type in the semiconductor substrate using a mask, wherein the tilt body implantation is implanted at an angle from a vertical direction; performing zero tilt body implantation by implanting dopants of the first conductivity type using the same mask, wherein the zero tilt body implantation is implanted with zero tilt from the vertical direction, and wherein the tilt body implantation and the zero tilt body implantation are configured to form a body region of the LDMOS device; and forming a source region and a drain contact region of the LDMOS device, wherein the source region and the drain contact region are of a second conductivity type.

In another embodiment, a method of fabricating an LDMOS device comprises: forming a gate of the LDMOS device on a semiconductor substrate; implanting dopants of a first conductivity type into a body region of the LDMOS device vertically; performing a rapid thermal annealing process and forming a short channel of the LDMOS device; and forming a source region and a drain contact region of the

2

LDMOS device, wherein the source region and the drain contact region are of a second conductivity type.

In yet another embodiment, an LDMOS device comprises: a gate; a drain region of a first conductivity type; a body region of a second conductivity type different from the first conductivity type; and a source region of the first conductivity type and formed in the body region; wherein the drain region is at one side of the gate and the source region is at the other side of the gate, and wherein the peak concentration of the second conductivity type is beneath the source region.

BRIEF DESCRIPTION OF THE DRAWINGS

Non-limiting and non-exhaustive embodiments are described with reference to the following drawings. The drawings are only for illustration purpose. Usually, the drawings only show part of the system or circuit of the embodiments. These drawings are not necessarily drawn to scale.

The use of the same reference label in different drawings indicates the same or like components.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

LDMOS devices according to some embodiments of the present invention are formed adopting zero-tilt body implantation and without conventional high-thermal-budget lateral body diffusion. Accordingly these LDMOS devices have short channel or small cell pitch, and also have relatively high punch-through voltage.

Figure 2:
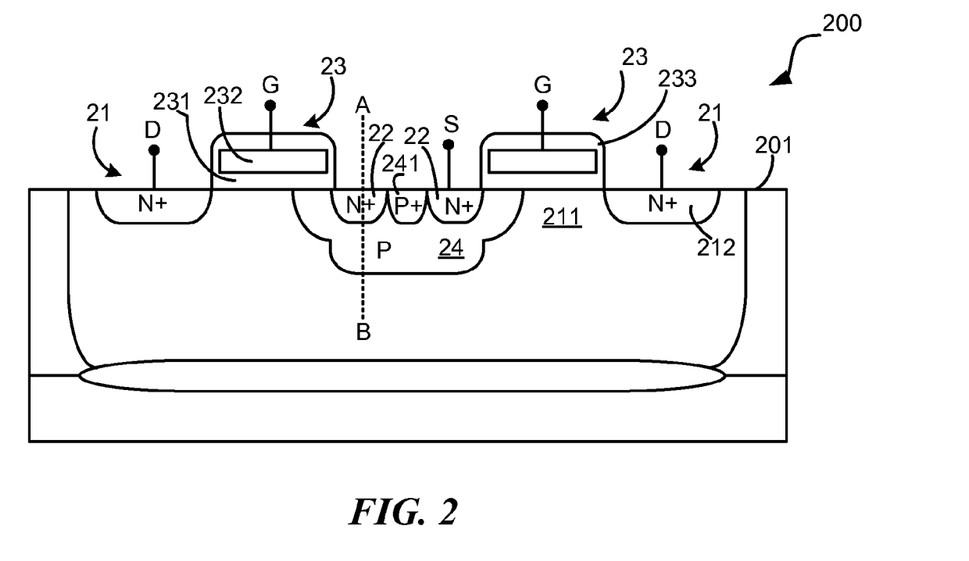
FIG. 2 illustrates a sectional view of an LDMOS device according to an embodiment of the present invention.

FIG. 2 illustrates a sectional view of an LDMOS device 200 according to an embodiment of the present invention.

LDMOS device 200 comprises an N-type drain region 21, an N-type source region 22, a gate region 23, and a P-type body region 24. In detail, the gate 23 comprises a dielectric layer 231, an electrical conducting layer 232 formed on the dielectric layer 231, and a gate seal oxide 233 formed on the electrical conducting layer 232 and on the side surface of the gate 23. The P-type body region 24 is adjacent to the drain region 21. The LDMOS device 200 further comprises a P+ body contact region 241 contacting the body region 24. The drain region 21 comprises a lowly doped N− drift region 211 and a highly doped N+ drain contact region 212. The highly doped N+ source region 22 is formed in the body region 24. In the sectional view as shown in FIG. 2, the drain region 21 is at one side of the gate region 23 while the source region 22 is at the other side of the gate region 23.

Continuing with FIG. 2, the body region 24 is at least partly formed by zero tilt implantation and is formed without conventional lateral diffusion which has high thermal budget. Accordingly, unlike the conventional lateral diffusion which has the peak concentration of P-type substances at the surface 201 of the semiconductor substrate required for lateral diffusion, the peak concentration of P-type substances of the body region according to the embodiment of the present invention is at the region beneath the N+ source region 22.

Figure 3:
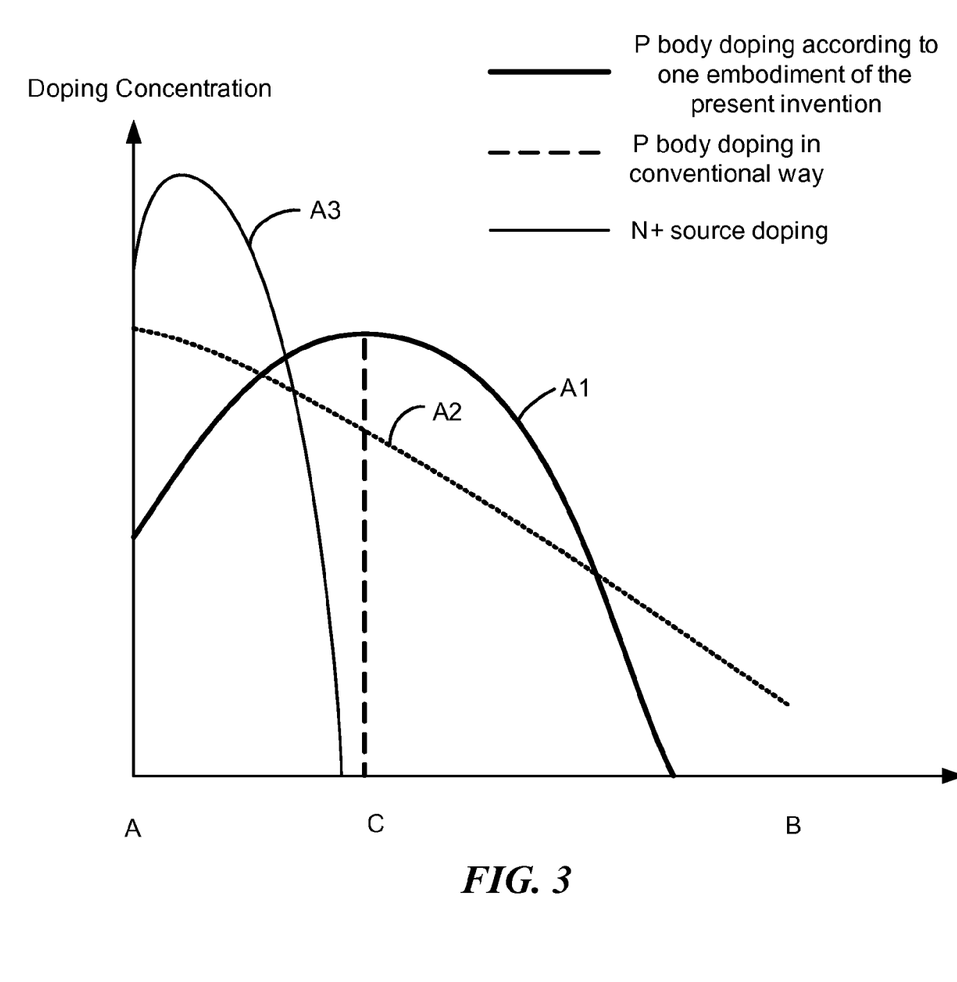
FIG. 3 illustrates a diagram of several doping concentration curves along a line AB traversing a source region and a body region in vertical direction, according to an embodiment of the present invention.

FIG. 3 illustrates a diagram of several doping concentration curves A1, A2 and A3 along a line AB traversing the source region 22 and body region 24 in vertical direction with reference to FIG. 2, according to an embodiment of the present invention. The curve A1 in bold represents the doping concentration of P-type substances along line AB according to an embodiment of the present invention which adopts a zero tilt body implantation and without conventional lateral body diffusion. The curve A2 in dotted line represents the doping concentration of P-type substances in the body region 24 along line AB, according to a conventional lateral diffused body region. And the curve A3 in thin line represents the doping concentration of N-type substances of the N+ source region 22 along line AB. It can be seen that in the conventional lateral diffused P-type body approach with reference to curve A2, the peak concentration of P-type substances is at point A, which is at the surface 201 of the semiconductor substrate. Whereas according to the embodiment of the present invention, when formed with zero tilt body implantation and without conventional lateral body diffusion, the peak concentration is at point C which is below the N+ source region 22, with reference to curve A1. This peak concentration distribution according to the embodiment of the present invention has advantages of lower body resistance to make LDMOS device robustness stronger without causing low punch-through breakdown voltage.

Figure 4:
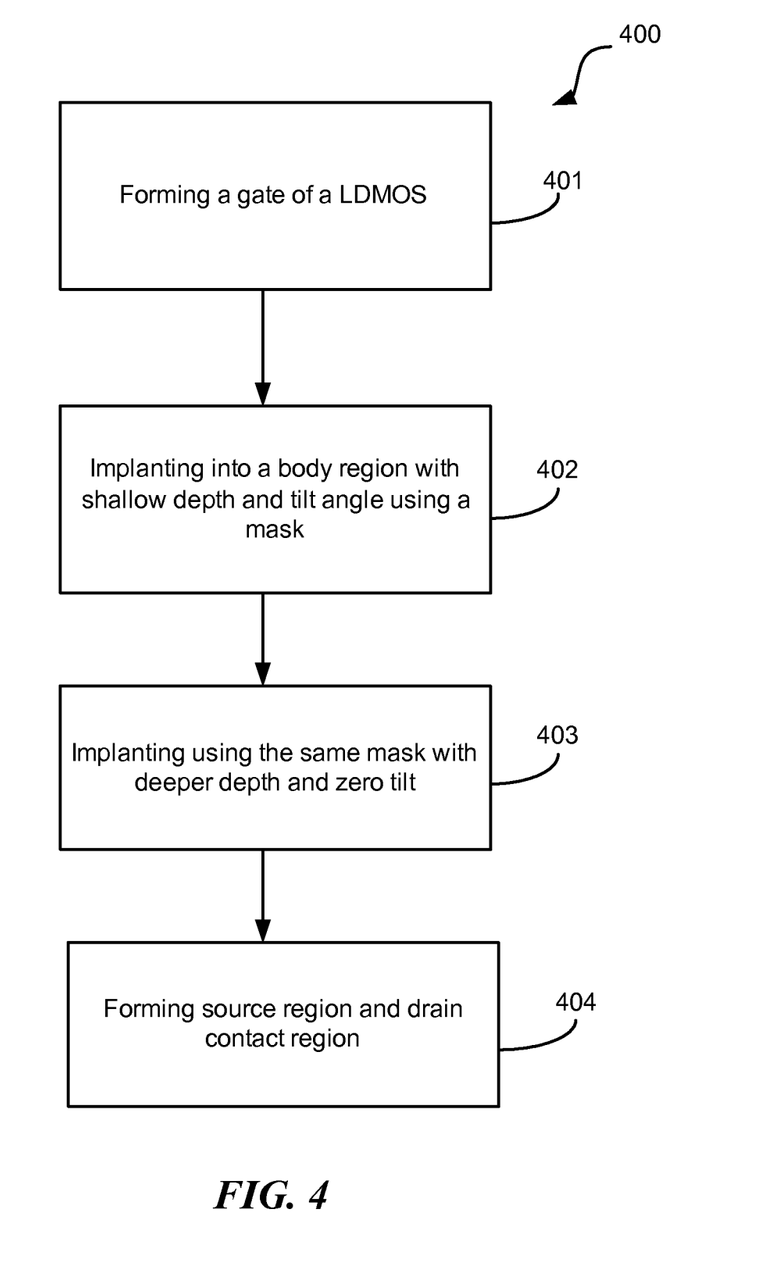
FIG. 4 illustrates a method of fabricating an LDMOS device according to an embodiment of the present invention.

FIG. 4 illustrates a method 400 of fabricating an LDMOS device according to an embodiment of the present invention. The method 400 comprises at a first step 401 forming a gate of the LDMOS device on a semiconductor substrate. In one embodiment, forming the gate comprises forming a dielectric layer on the semiconductor substrate and then forming an electrical conducting layer on the dielectric layer. The method 400 further comprises in a second step 402 performing tilt body implantation by implanting P-type dopants into a body region of the LDMOS device in the semiconductor substrate with shallow depth and tilt angle using a mask. This tilt body implantation aims to form a channel region of the LDMOS device and to increase the punch-through voltage of the LDMOS device. After the tilt body implantation, the method 400 further comprises in step 403 performing zero tilt body implantation by implanting P-type dopants into the same body region with a deeper junction using the same mask. And the zero tilt body implantation is performed with a zero tilt. The zero tilt body implantation in step 403 has a depth deeper than the tilt body implantation taken out in step 402 and is partly overlapped with the tilt body implantation region. The zero tilt body implantation adds on a deeper junction to improve Safe Operating Area (SOA) of the LDMOS device. In the meantime, the zero tilt body implantation shares a same mask with the tilt body implantation and is cost effective. The tilt body implantation and the zero tilt body implantation are configured to form a body region of the LDMOS device. A more detailed process flow embodiment will be described with reference to FIGS. 5A-5I.

FIGS. 5A-5I illustrate a process flow of fabricating an LDMOS device according to an embodiment of the present invention.

Figure 5A:
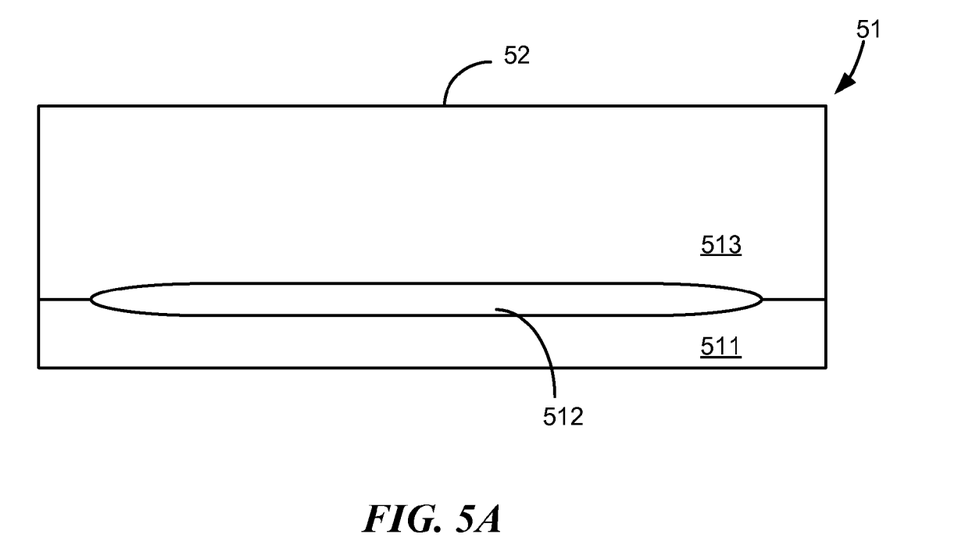
FIGS. 5A-5I illustrate a process flow of fabricating an LDMOS device according to an embodiment of the present invention.

In FIG. 5A, a semiconductor substrate 51 is provided. The semiconductor substrate 51 comprises an original substrate 511, an N-type Buried Layer (NBL) 512 and an epitaxial layer 513. The original substrate 511 may be N type, P type or intrinsic semiconductor material. The NBL 512 may be replaced with other structures. The epitaxial layer 513 may be N type, P type or intrinsic semiconductor material and has a top surface 52. The semiconductor substrate 51 may have other circuit(s)/device(s)/system(s) integrated in it. In some embodiments, the semiconductor substrate may have other configuration or without some of the above regions.

Figure 5B:
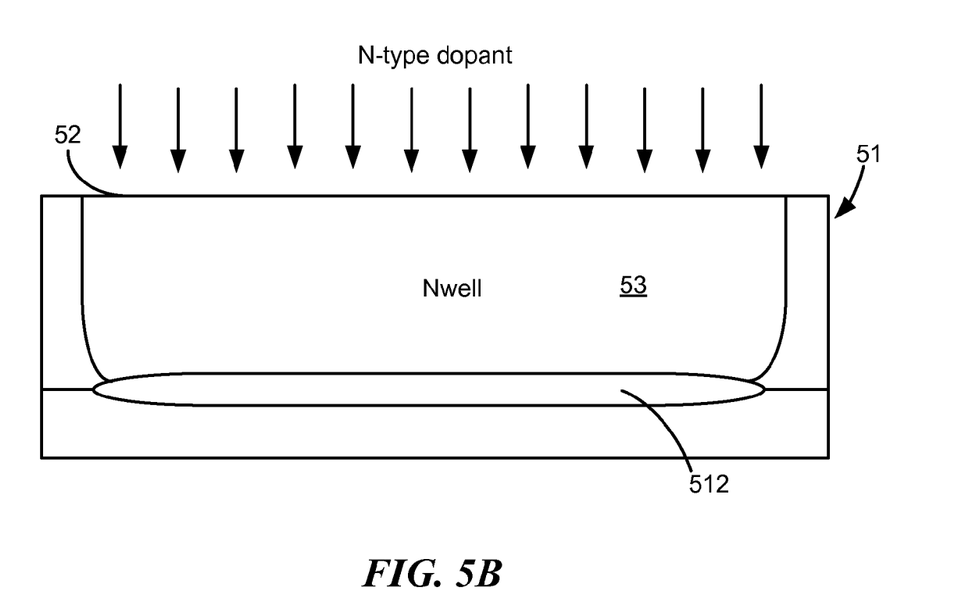

In FIG. 5B, N-type dopants are implanted into the semiconductor substrate 51 from the top surface 52 to form an N-type well 53. The N-type well 53 is lightly doped and has a lower doping concentration than that in a source region or a drain contact region of the LDMOS device. In the shown embodiment, the doping depth is controlled that the N-type well 53 contacts with the NBL 512.

Figure 5C:
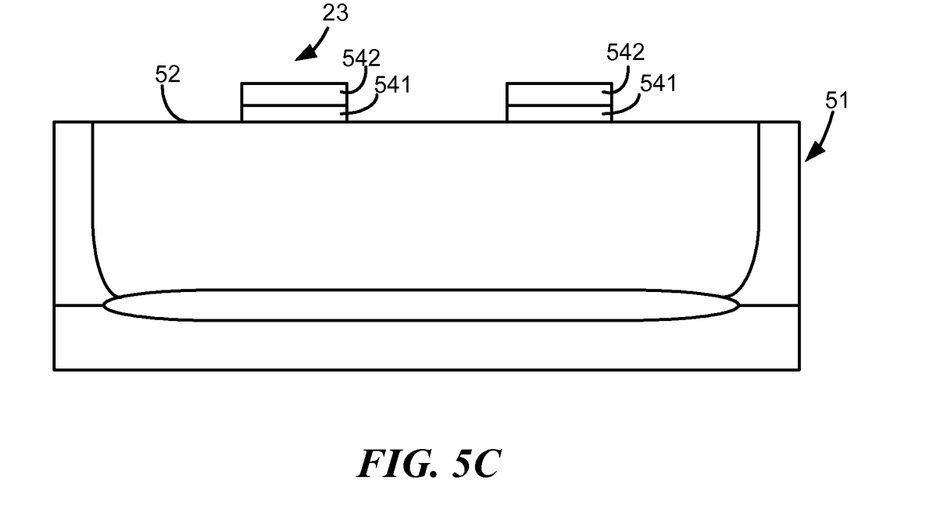

In FIG. 5C, a gate region 24 is formed on the surface 52. Forming the gate 23 comprises forming a dielectric layer 541 on the surface 52 of the semiconductor substrate 51, and then forming an electrical conducting layer 542 on the dielectric layer 541. In one embodiment, the dielectric layer 541 comprises silicon dioxide (SiO2), and the conducting layer 542 comprises polycrystalline silicon. In one embodiment, after forming the silicon dioxide layer and polycrystalline silicon layer, forming the gate 23 may further comprise patterning the gate by etching via a mask.

Figure 5D:
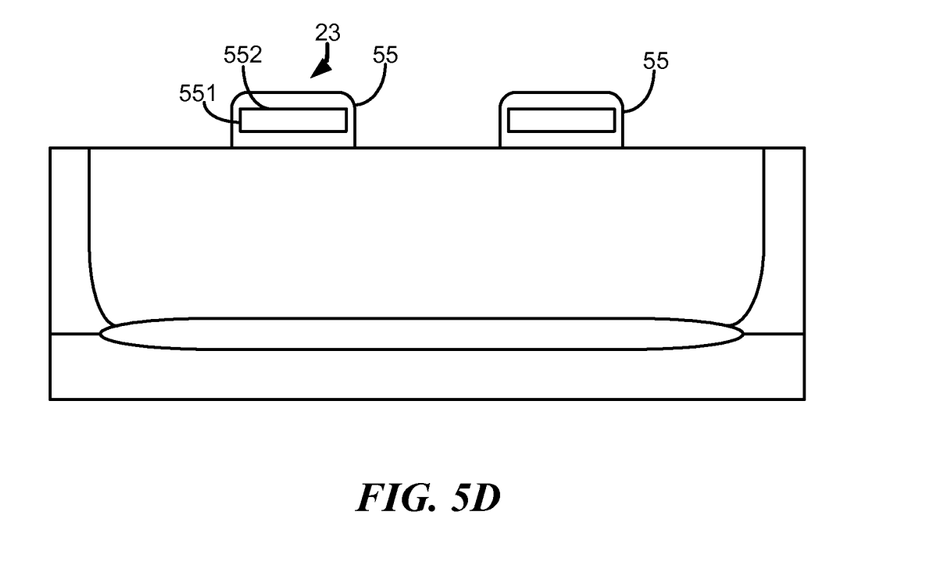

In FIG. 5D, gate seal oxide 55 is formed at the sidewall 551 and top surface 552 of the gate 23. However, in another embodiment, the gate seal oxide may be not necessary or replaced by other structures.

Figure 5E:
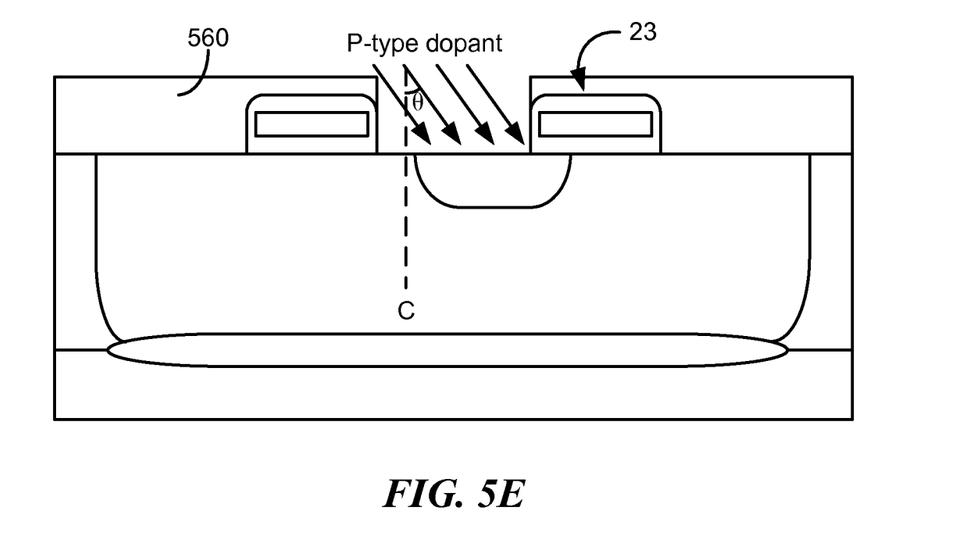

In FIG. 5E, a mask 560 is adopted and P-type dopants are implanted into an opening of the mask 560 from a first direction at an angle θ from the vertical direction C to form a part of the body region. A direction may contain information in a three dimensional coordinates. With this tilt body implantation, P-type dopants are implanted under the gate 23 to form the channel at one side.

Figure 5F:
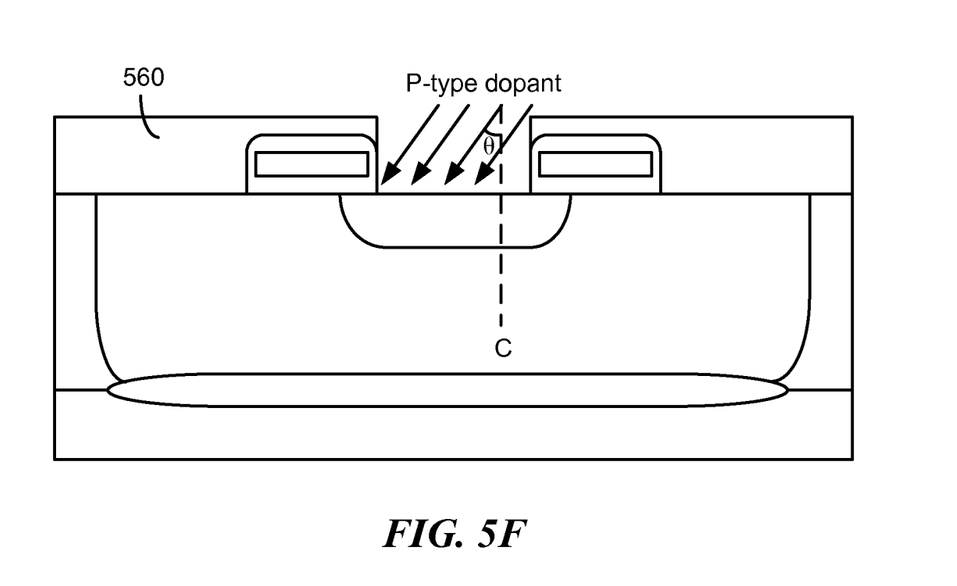

In FIG. 5F, the direction of tilt body implantation is adjusted, and P-type dopants are implanted in the same opening of the mask 560 from a second direction at the angle θ from the vertical direction C, to form the channel of the LDMOS device at another side.

In one embodiment, tilt body implantation may be further performed from a third direction and from a fourth direction both at the angle θ from the vertical direction C. In one embodiment, the first direction, the second direction, the third direction and the fourth direction each is separated form the next direction by 90 degrees rotated from the vertical axis C. Or in other words, when the first direction, the second direction, the third direction and the fourth direction each has a projected direction angle in a horizontal plane with a first projected direction angle, a second projected direction angle, a third projected direction angle and a fourth projected direction angle respectively, the first projected direction angle, the second projected direction angle, the third projected direction angle and the fourth projected direction angle in the horizontal plane each is separated from the next by 90 degrees, wherein the horizontal plane is a plane perpendicular to the vertical axis C. Accordingly, the LDMOS transistors can be oriented in any of the four directions.

Figure 5G:
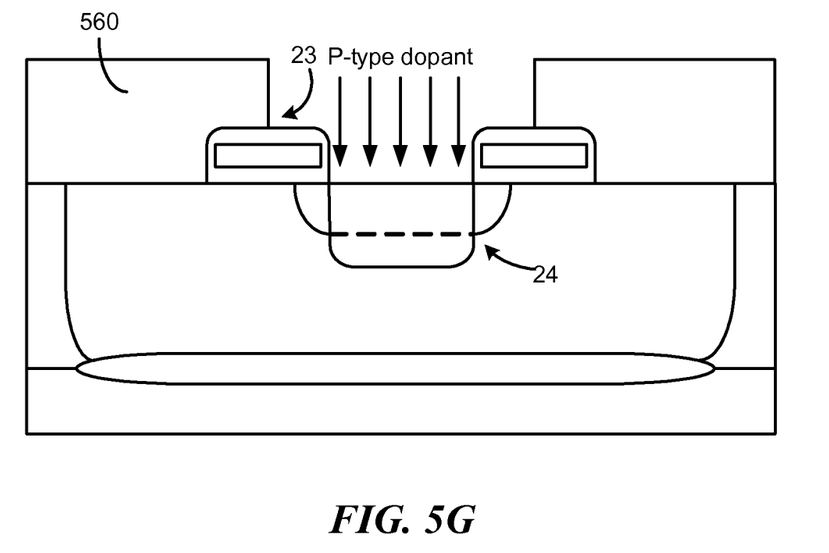

In FIG. 5G, zero tilt body implantation is performed and P-type dopants are implanted vertically with zero tilt from the vertical direction into the same opening of the mask 560. The zero tilt body implantation has a deeper junction than the tilt body implantation. And the body region is formed by the combination of the tilt body implantation and the zero tilt body implantation. Since no lateral body diffusion is required, the doping concentration of the P-type dopants may be controlled beneath the source region of the LDMOS device.

Figure 5H:
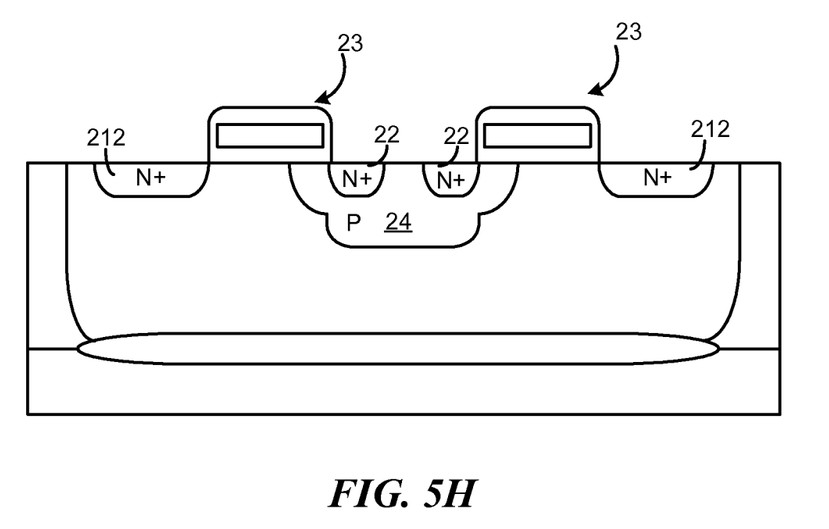

In FIG. 5H, N-type dopants are implanted with high doping concentration to form the N+ source region 22 at one side of the gate 23 and the N+ drain contact region 212 at the other side of the gate 23.

Figure 5I:
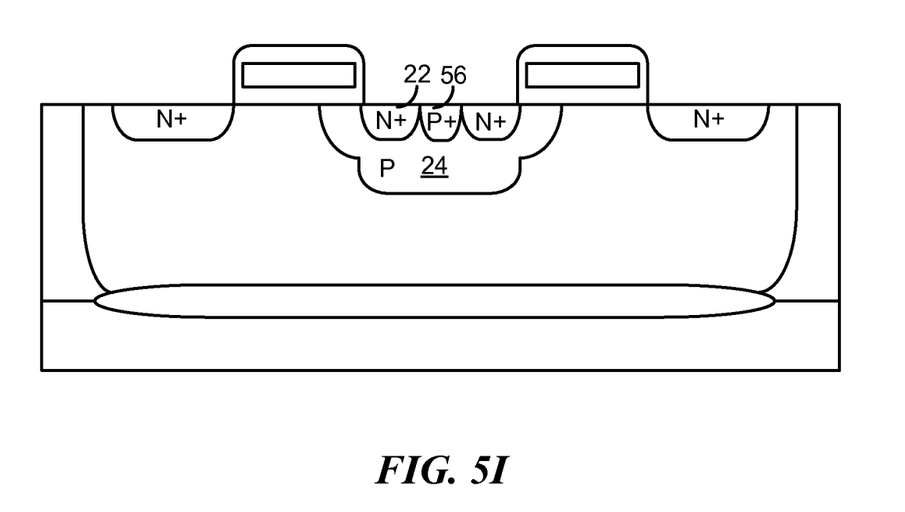

And in FIG. 5I, P type substances of high doping concentration are implanted in the body region 24 between the source regions 22 to form a P+ body contact region 56. In one embodiment, P+ body contact region 56 is shorted to the N+ source region 22 by forming an electrical conducting layer on them.

Some other prior art steps such as forming contacts, interconnection, and packaging, are not shown for ease of illustration. However, embodiments with these prior art steps are also within the spirit and scope of the invention as defined by the appended claims.

Figure 6:
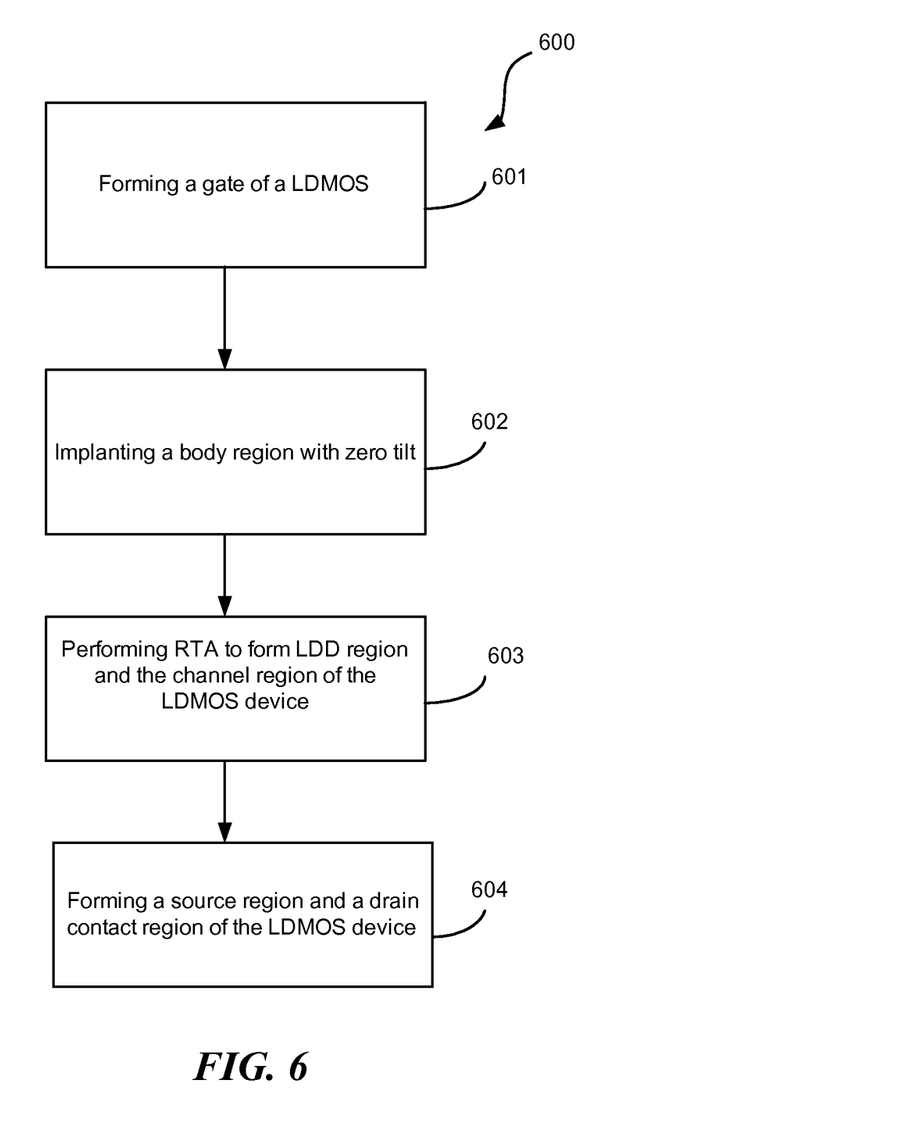
FIG. 6 illustrates a method of fabricating an LDMOS device according to another embodiment of the present invention.

FIG. 6 illustrates a method 600 of fabricating an LDMOS device according to another embodiment of the present invention. The method 600 comprises at a first step 601 forming a gate of the LDMOS device on a semiconductor substrate. In one embodiment, forming the gate comprises forming a dielectric layer on the semiconductor substrate and then forming an electrical conducting layer on the dielectric layer. The method 600 further comprises in a second step 602 implanting P-type dopants into a body region of the semiconductor substrate vertically with zero tilt. In step 603, a Rapid Thermal Annealing (RTA) process is performed. The RTA process aims to form lightly doped drain (LDD) region(s) or lightly doped source region(s) as well as to form the short channel region of the LDMOS device. The RTA process has lower thermal budget than the conventional annealing process for forming the laterally diffused body region, and thus has less affect to other junctions and also is suitable for forming a short channel of an LDMOS device. And in step 604, source region and drain contact region are formed. A more detailed process flow embodiment will be described with reference to FIGS. 7A-7I.

FIGS. 7A-7I illustrate a process flow of fabricating an LDMOS device according to an embodiment of the present invention.

The processes in FIGS. 7A-7D are similar to those in FIGS. 5A-5D. For ease of illustration, the description to FIGS. 7A-7D will not be described in detail and may refer to the descriptions with reference to FIGS. 5A-5D.

Figure 7A:
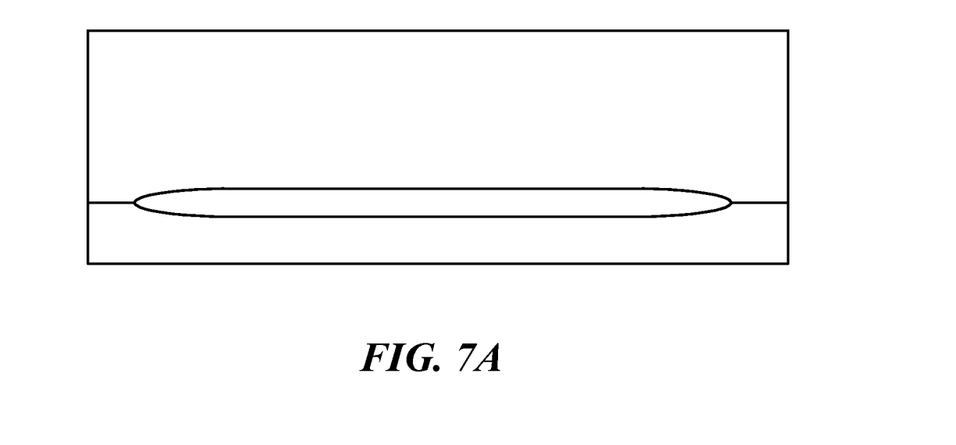
FIGS. 7A-7I illustrate a process flow of fabricating an LDMOS device according to an embodiment of the present invention.
Figure 7B:
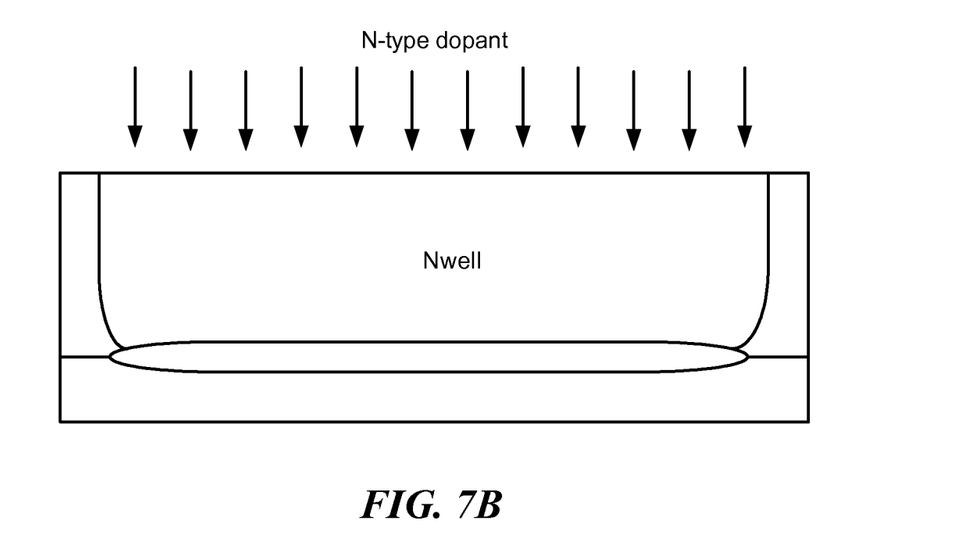
Figure 7C:
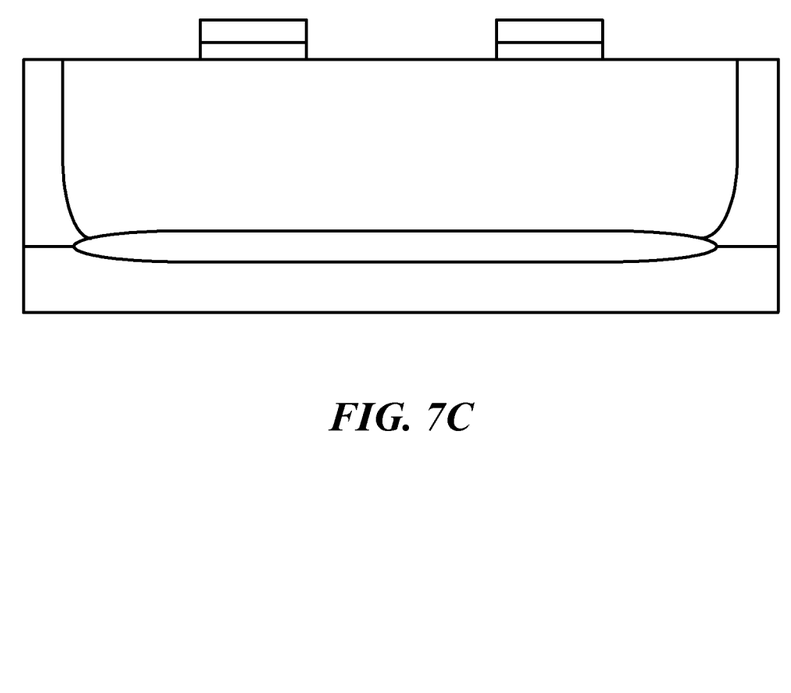
Figure 7D:
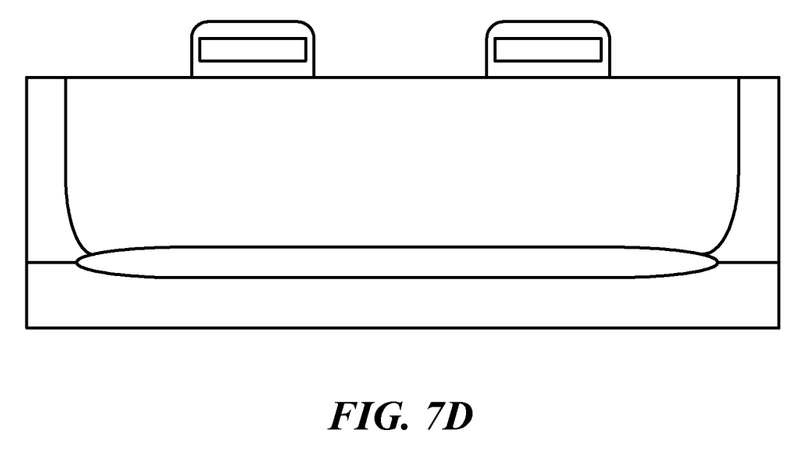
Figure 7E:
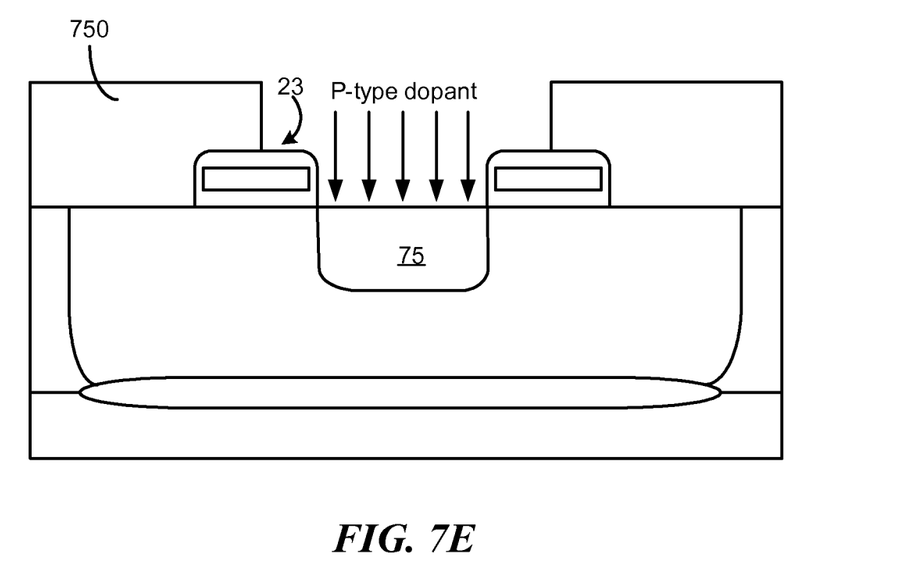

In FIG. 7E, a mask 750 is adopted and P-type dopants are implanted into an opening of the mask 750 with zero tilt angle from the vertical direction to form a body region of the LDMOS device. In the shown embodiment, the P-type region 75 is implanted self-aligned to the gate region 23. It would be apparent to persons of ordinary skill in the art that the final shape of the body region of a LDMOS device will be affected and adjusted by the later processes which affect the junction depth of different regions.

Figure 7F:
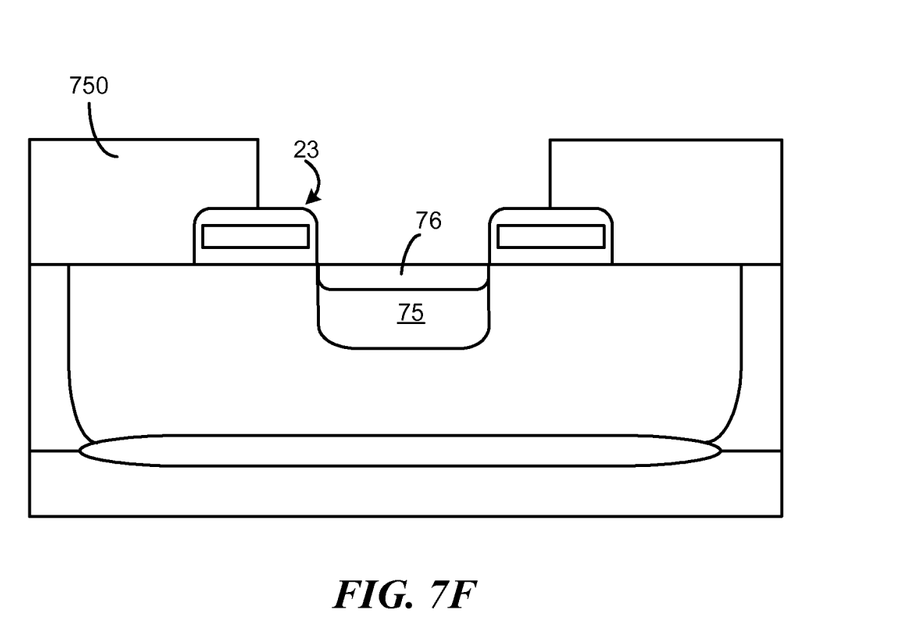

In FIG. 7F, an LDD region 76 is formed by implanting lightly doped N-type substances. And in another embodiment, a P-type LDD region may be formed by implanting P-type lightly doped substances. In the shown embodiment, an N-type LDD region 76 is formed in the P-type body region 75 with a shallower junction than that of the body region 75. The N-type LDD region 76 may be formed substantially self-aligned to the gate region 23 and sharing the same mask 750 with the body region 75 and accordingly no additional mask is required. In another embodiment, a LDD region is formed in other area(s) of the semiconductor substrate. However, in yet another embodiment, an LDD region may be not required.

Figure 7G:
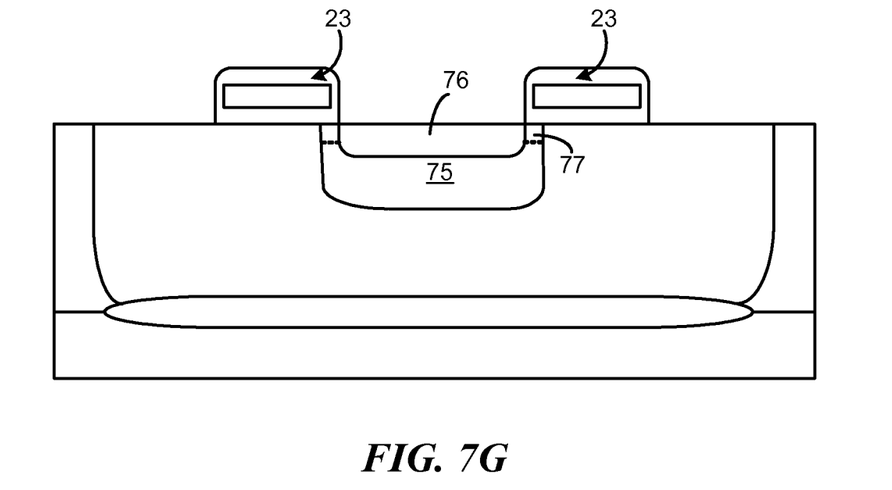

And then in FIG. 7G, RTA process is taken out to activate the implanted N-type LDD region 76. In the meantime, the P-type body region 75 diffuses laterally under the gate 23 to form a short channel 77. The P-type dopants of boron is more diffusive than the N-type dopants of phosphorus, thus when the phosphorus atoms are implanted with the same mask for implanting the boron atoms of the body region, after RTA process, the boron diffuses farther than the phosphorus to form the short channel 77.

Figure 7H:
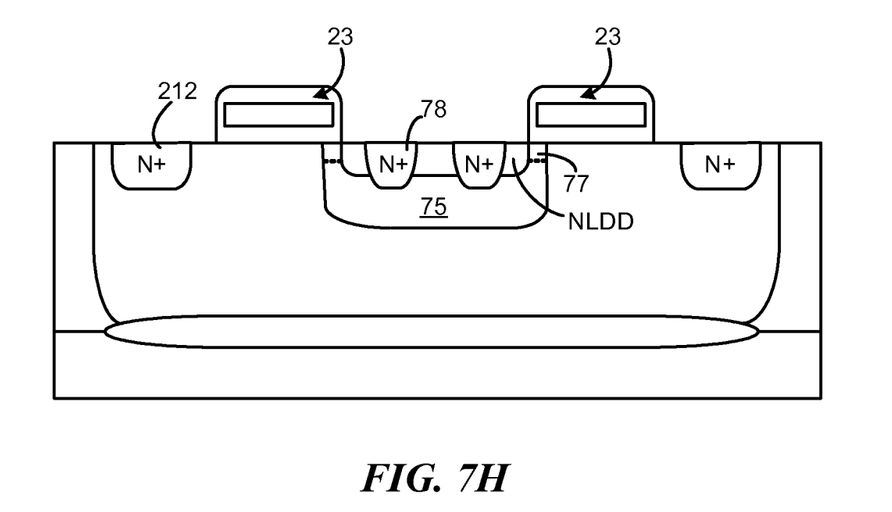

In FIG. 7H, N-type dopants with high doping concentration are implanted to form the N+ source region 78 and the N+ drain contact region 212.

Figure 7I:
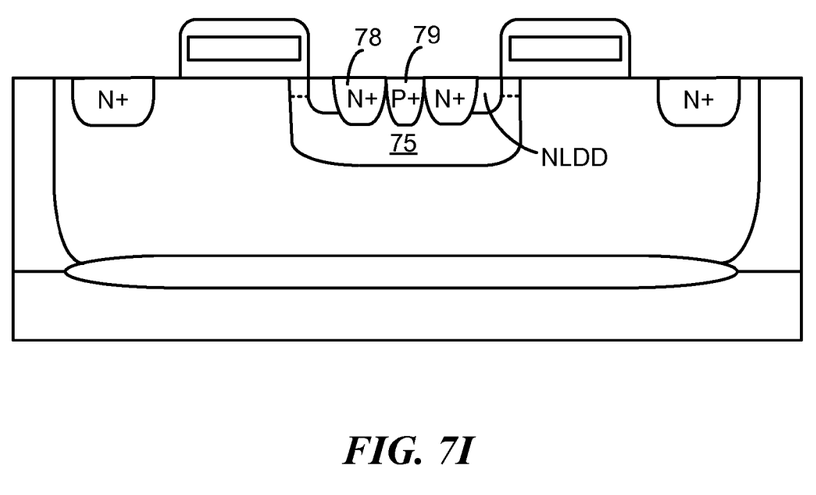

And in FIG. 7I, P-type dopants with high doping concentration are implanted between the source regions 78 and contacting the body region 75 to form the P+ body contact region 79. In one embodiment, the P+ body contact region 79 is electrically shorted to the N+ source region 78 by forming an electrical conducting layer on them.

The process flow steps as illustrated above are not meant to confine the processing sequences, and the processing sequences may differ from those referred in the appended drawings.

It should be known that the conductivity type for each region may be in an alternating type, for example, the N type regions may be replaced with P type regions while the P type regions are replaced with N type regions. In one embodiment as claimed in the appended claims, the first conductivity type may be N type and the second conductivity type is P type. And in another embodiment, the first conductivity type is P type and the second conductivity type is N type.

The N type substance can be selected from one of the following: nitrogen, phosphorus, arsenic, antimony, bismuth and the combination thereof. And the P type substance can be selected from one of the following: boron, aluminum, gallium, indium, thallium and the combination thereof.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

We claim:

1. A method of fabricating an Lateral Diffused Metal Oxide Semiconductor field effect transistor (LDMOS) device, comprising:

forming a gate of the LDMOS device on a semiconductor substrate;

performing tilt body implantation by implanting dopants of a first conductivity type in the semiconductor substrate using a mask, wherein the tilt body implantation is implanted at an angle from a vertical direction;

performing zero tilt body implantation by implanting dopants of the first conductivity type using the same mask, wherein the zero tilt body implantation is implanted with zero tilt from the vertical direction, and wherein the tilt body implantation and the zero tilt body implantation are configured to form a body region of the LDMOS device; and forming a source region and a drain contact region of the LDMOS device, wherein the source region and the drain contact region are of a second conductivity type different from the first conductivity type.

2. The method of claim 1, wherein forming the gate comprises forming a dielectric layer on the semiconductor substrate and then forming an electrical conducting layer on the dielectric layer.

3. The method of claim 1, wherein the zero tilt body implantation is deeper than the tilt body implantation.

4. The method of claim 1, further comprising forming a well by implanting dopants of the second conductivity type into the semiconductor substrate, wherein the well is formed before forming the gate, and the well contacting with a buried layer, and further wherein the well has a lower doping concentration than the source region and the drain contact region.

5. The method of claim 1, further comprising forming a gate seal oxide at sidewall of the gate and top surface of the gate.

6. The method of claim 1, wherein performing the tilt body implantation comprises implanting into an opening of the mask from a plurality of directions at the angle from the vertical direction, wherein the tilt body implantation is configured to form a channel region of the LDMOS device.

7. The method of claim 6, wherein the plurality of directions comprises four directions.

8. The method of claim 1, wherein the first conductivity type is P type and the second conductivity type is N type.

9. A method of fabricating an LDMOS device, comprising:
forming a gate of the LDMOS device on a semiconductor substrate;

implanting dopants of a first conductivity type into a body region of the LDMOS device vertically, and implanting lightly doped substances of a second conductivity type different from the first conductivity type by sharing the same mask with the body region with a shallower junction than that of the body region;

performing a rapid thermal annealing process to form a short channel of the LDMOS device and at the meantime to activate the lightly doped substances to form a lightly doped drain (LDD) region; and forming a source region and a drain contact region of the LDMOS device, wherein the source region and the drain contact region are of a second conductivity type different from the first conductivity type.

10. The method of claim 9, wherein forming the gate comprises forming silicon dioxide on the semiconductor substrate, and then forming polycrystalline silicon on the silicon dioxide.

11. The method of claim 9, wherein the dopants of the first conductivity type are implanted self-aligned to the gate.

12. The method of claim 9, further comprising forming a lightly doped drain region.

13. The method of claim 9, further comprising forming a well by implanting dopants of the second conductivity type into the semiconductor substrate, wherein the well is formed before forming the gate, and the well contacts with a buried layer, and wherein the well has a lower doping concentration than the source region and the drain contact region.

14. The method of claim 9, further comprising forming a gate seal oxide at sidewall and top surface of the gate.

15. The method of claim 9, wherein the first conductivity type is P type and the second conductivity type is N type.

\* \* \* \* \*